United States Patent
Hwang et al.

(12)

(10) Patent No.: US 6,269,281 B1
(45) Date of Patent: Jul. 31, 2001

(54) BACK LAPPING IN-LINE SYSTEM FOR SEMICONDUCTOR DEVICE FABRICATION

(75) Inventors: Do-yun Hwang; Jin-heung Kim, both of Kyungki-do (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/234,498

(22) Filed: Jan. 21, 1999

(30) Foreign Application Priority Data

Jan. 23, 1998 (KR) ........................................... 98-1983

(51) Int. Cl.⁷ .................................................. G06F 19/00
(52) U.S. Cl. ............................................. 700/121; 438/759
(58) Field of Search ..................................... 700/121, 164, 700/2, 9; 156/344, 154, 584; 438/759, 464; 451/43, 5

(56) References Cited

U.S. PATENT DOCUMENTS 5,537,325 * 7/1996 Iwakiri et al. ........................ 700/121
5,679,060 * 10/1997 Leonard et al. ........................ 451/43
5,840,614 * 11/1998 Sim et al. ............................... 438/464
6,030,485 * 2/2000 Yamada .................................. 156/344

* cited by examiner

Primary Examiner—Paul P. Gordon
Assistant Examiner—Steven R. Garland
(74) Attorney, Agent, or Firm—Jones Volentine, PLLC

(57) ABSTRACT

A back lapping in-line system for semiconductor device fabrication carries out a vinyl covering, a back side grinding, and a vinyl removing for grinding the back side of a wafer in-line with one single process. The back lapping in-line system has a server connected to a network line, a program therein for controlling the in-line processes, and an in-line facility connected to the server by a standard communication line, wherein parts of the in-line facility are assembled in order, and each part carries out its corresponding process according to information communicated to and from the server, and unloads the wafer after it passes through all of the corresponding processes successively. The in-line facility uses a single loading and unloading, and needs no storage space between parts.

5 Claims, 3 Drawing Sheets

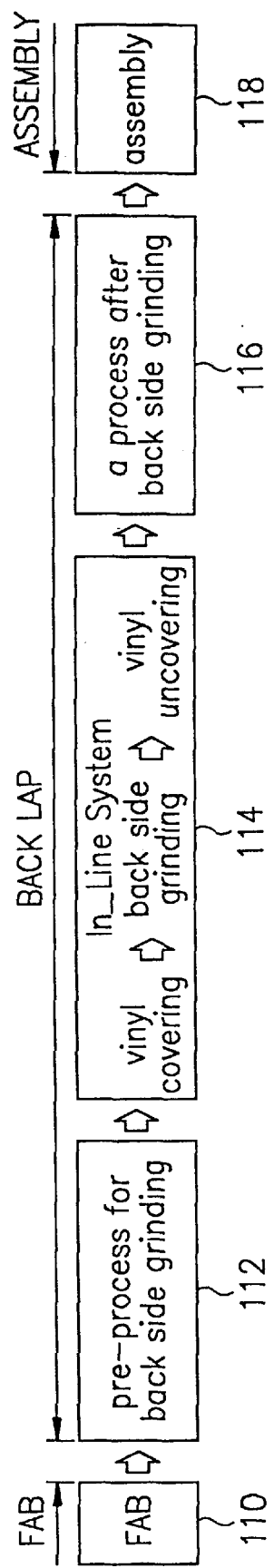

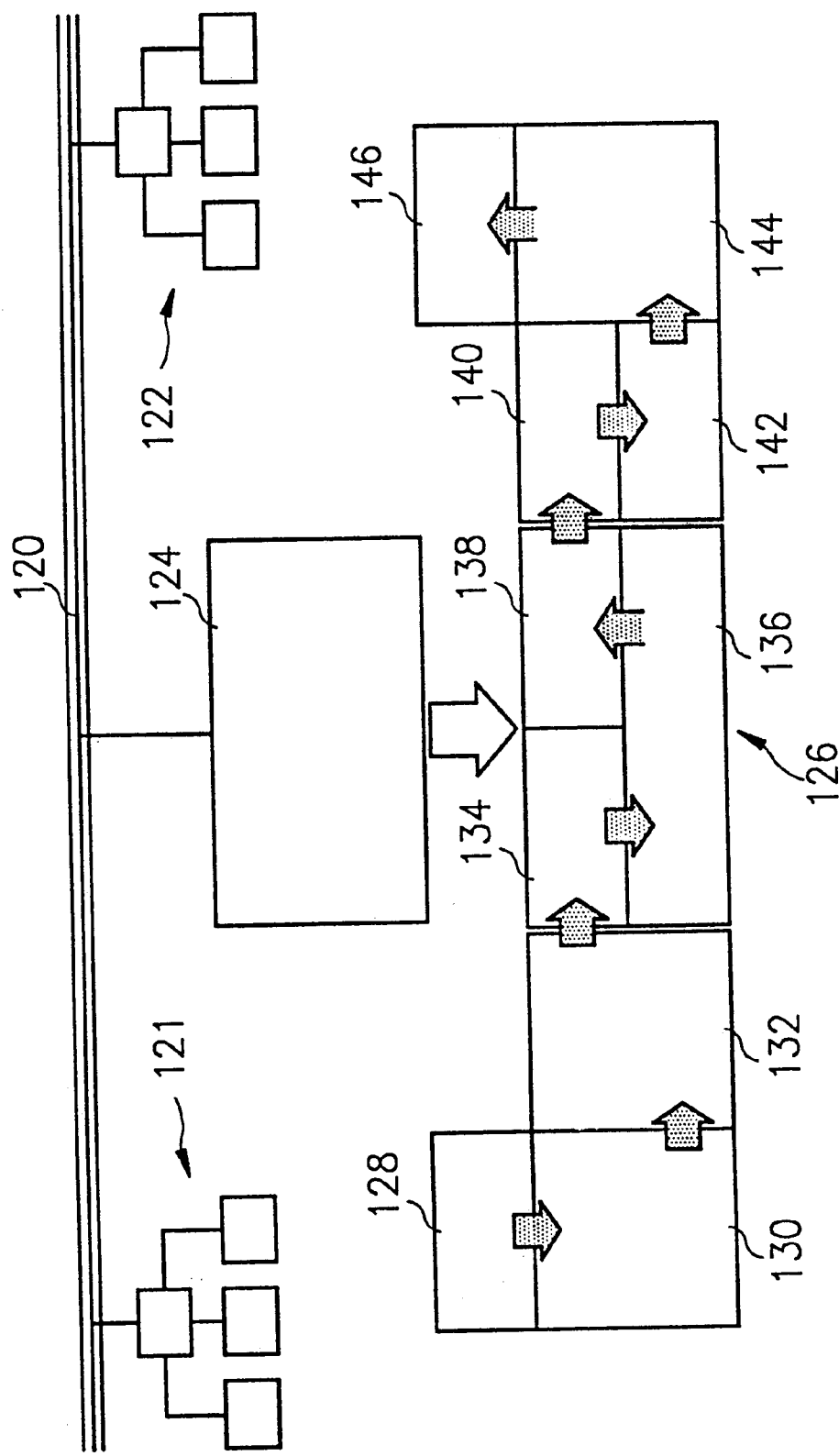

BACK LAPPING IN-LINE SYSTEM FOR SEMICONDUCTOR DEVICE FABRICATION

BACKGROUND OF THE INVENTION

1. Field of the Invention

The present invention relates to a back lapping in-line system for semiconductor device fabrication, and more particularly, to a back lapping in-line system for carrying out an array of processes in-line, including vinyl covering, back side grinding, and vinyl removing.

2. Background of the Related Art

Generally, semiconductor wafers are processed into packages, and before the package process, the back side of the wafer is ground. The array of processes including the back side grinding is called "back lap" or "back grind".

FIG. 1 shows a conventional back lap process, including back side grinding using a grinder carried out between a wafer fabrication process 10 and an assembly process 22. The back lap process comprises a pre-process for back side grinding 12, a vinyl covering 14, a back side grinding 16, a vinyl removing 18, and a process after back side grinding 20.

The vinyl covering step 14 covers the front side of the wafer with vinyl in order to protect the front side of the wafer with the pattern formed thereon from silicon particulate produced during the back side grinding 16. The vinyl removing step 18 removes the vinyl from the wafer surface, since the vinyl is no longer needed after the back side grinding 16.

In the back side grinding 16, the back side of the wafer is ground using a diamond wheel, and frictional heat is generated during the back side grinding. The wafer may become warped by this heat, causing warpage failure.

The larger the wafer, the more serious the warpage failure, which causes errors in loading and unloading of wafers on a cassette. Sometimes, the warpage failure renders the wafer unusable.

FIG. 2 shows a structure of a conventional facility in which the vinyl covering, back side grinding, and vinyl removing shown in FIG. 1 can be carried out.

Referring to FIG. 2, a network line 30 is connected to manual interfaces 32, 34 and 36, which connect to a laminator 38 to carry out the vinyl covering, a back grinder 40 for the back side grinding, and a remover 42 for the vinyl removing, respectively.

The laminator 38 comprises: a loading part 44, a pre-cut part 46, a centering part 48, a wire cut part 50, and an unloading part 52. The back grinder 40 comprises: a loading part 54, a centering part 56, a grinding part 58, a cleaning part 60, and an unloading part 62. The remover 42 comprises: a loading part 64, a centering part 66, a UV (ultra violet) irradiation part 68, a removing part 70, and an unloading part 72.

The laminator 38, the back side grinder 40, and the remover 42 are connected to a host computer (not shown), or other facility, via their own manual interfaces 32, 34 and 36, respectively, so as to communicate information and carry out their corresponding operations.

However, the laminator 38, the back side grinder 40, and the remover 42 of the conventional facility have their own loading and unloading parts as shown in FIG. 2; that is, there are common elements in each facility unit.

As a result, time is lost in the conventional facility while loading and unloading at each part. Furthermore, the facility requires temporary holding areas for transferring wafers between the laminator 38 and the back grinder 40, and between the back grinder 40 and the remover 42, respectively, thereby requiring additional work space.

In case of a wafer which has a warpage failure after back side grinding, there is a higher risk of it being scratched or broken due to its warped state while it passes through three loading and unloading steps, thereby decreasing production yield.

That is, the conventional facility for back side grinding has problems which decrease productivity, wherein first, wafers are under a higher risk of being damaged during their loading or unloading because the wafers are loaded or unloaded multiple times; second, the conventional facility needs holding space because each unit process is carried out in its corresponding separate facility unit; and third, TAT (Turn Around Time) is longer in the conventional facility because continuity is lost between facility units while performing one single run, and a process can be carried out only after the previous process has been completed.

SYNNART OF THE INVENTION

The present invention is directed to a back lapping in-line system for semiconductor device fabrication for carrying out in-line the processes of vinyl covering, back side grinding, and vinyl removing, so as to grind the back side of a wafer in one single process, which substantially overcomes one or more of the problems due to the limitation and the disadvantages of the related art.

Another object of the present invention is to provide a back lapping in-line system for semiconductor device fabrication for reducing damage to warped inferior wafers by in-line systemizing the unit processes for grinding the back side of a wafer, such as the vinyl covering, the back side grinding, and the vinyl removing, and thus reducing the wafer transfer time between unit processes.

Still another object of the present invention is to provide a back lapping inline system for semiconductor device fabrication for removing unnecessary space for storing wafers between unit processes, by in-line systemizing the unit processes for grinding the back side of a wafer, such as vinyl covering, back side grinding, and vinyl removing.

A further object of the present invention is to provide a back lapping in-line system for semiconductor device fabrication for reducing Turn Around Time by in-line systemizing the unit processes for grinding the back side of a wafer, such as vinyl covering, back side grinding, and vinyl removing.

To achieve these and other advantages, and in accordance with the purpose of the present invention as embodied and broadly described, the back lapping in-line system for semiconductor device fabrication comprises: a server connected to a network line, and having a program therein for controlling a plurality of in-line processes; and an in-line facility connected on-line to the server by a standard communication line, wherein the in-line facility has a plurality of parts, the parts are assembled in order, and each part carries out its corresponding process according to information communicated to and from the server. The plurality of in-line processes comprises: a vinyl covering process, a back side grinding process, and a vinyl removing process, performed successively.

In addition, the plurality of parts of the in-line facility comprises: a loading part in which a wafer is loaded; a first centering part in which a first centering is carried out; a taping laser cutting part in which a pattern surface of the wafer is covered with vinyl, after which the vinyl is trimmed; a second centering part in which a second centering is carried out; a grinding part in which a back side of the wafer is ground; a cleaning part in which the wafer is cleaned; a third centering part in which a third centering is carried out; a UV irradiation part in which the wafer is irradiated with UV light; a removing part in which the vinyl softened by the UV irradiation is removed; and an unloading part for unloading the wafer, wherein each part of the back lapping in-line system carries out its corresponding process, and transfers the wafer controlled by communication to and from the server.

The back lapping in-line system further comprises a plurality of transfer belts or robots with robot arms positioned between adjacent parts of the in-line facility, which transfer the wafer from one part to another.

In addition, the server can be constructed such that the processes are carried out only in pre-selected parts, and non-selected parts transfer the wafer without carrying out their processes.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention in which:

FIG. 3 shows process sequences for semiconductor device fabrication including a back lapping in-line process according to the present invention; and FIG. 4 is a block diagram of a system for the back lapping in-line process according to one embodiment of the present invention.

DETAILED DESCRIPTION OF PREFERRED EMBODIMENTS

Figure 1:
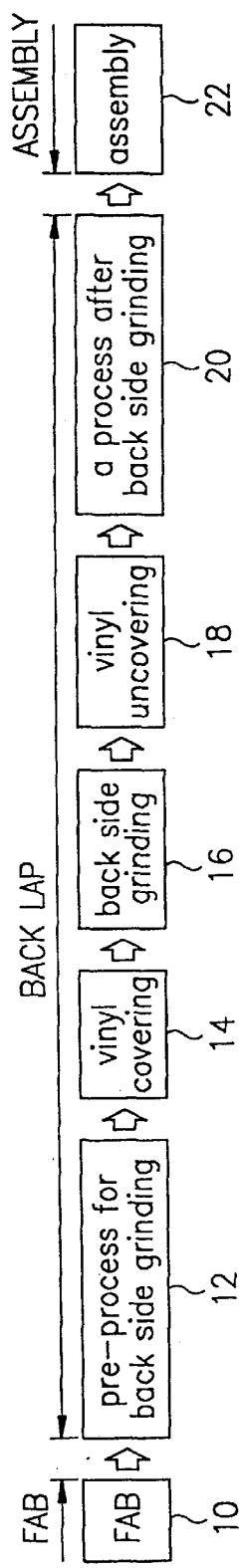
Fig. 1 shows process sequences for conventional semiconductor device fabrication including a back lapping process.
Figure 2:
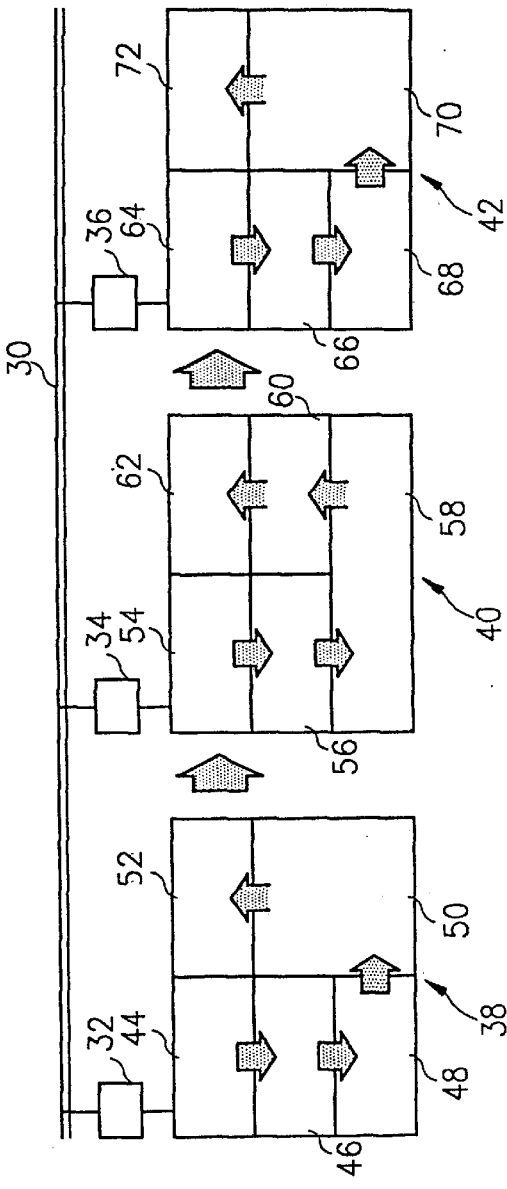
FIG. 2 is a block diagram of a system for the conventional back lapping process.

Reference will now be made in detail to a preferred embodiment of the present invention, an example of which is illustrated in the accompanying drawings.

According to one embodiment of a back lapping in-line system, a series of back lapping processes for grinding the back side of a wafer, such as vinyl covering, back side grinding, and vinyl removing, which are carried out between the fabrication process 110, and the assembly process 118 shown in FIG. 3, can be carried out as one single unit in-line process 114. Before and after the in-line process 114, a pre-process for back side grinding 112, and a process after back side grinding 116, are carried out respectively.

The in-line process 114 of FIG. 3 is carried out by means of the system of FIG. 4. Referring to FIG. 4, other systems 121, 122 may be connected to a network line 120, and there is also connected thereto a server 124 having a program therein to carry out the in-line process. The server 124 is connected on-line to the in-line facility 126 through a standard communication line to transfer necessary information to the in-line facility 126.

The in-line facility 126 comprises: a loading part 128, a centering part 130, a taping laser cutting part 132, a centering part 134, a grinding part 136, a cleaning part 138, a centering part 140, a UV irradiation part 142, a removing part 144, and an unloading part 146. Between these facilities, there is installed a transferring mechanism, positioned for example at the arrows A in FIG. 4, for transferring wafers. The transferring mechanism may comprise robots which transfer wafers by means of robot arms, or transfer belts along which wafers move. Each wafer is loaded in the loading part 128, passes through each of the above facility components for its corresponding process, and finally is unloading in the unloading part 146.

In particular, after the pre-process for back side grinding 112 is completed, the wafer is transferred and loaded in the loading part 128, and is transferred to the centering part 130, wherein a first centering is carried out on the wafer so that the wafer is aligned for a subsequent taping laser cutting treatment. The wafer is then transferred to the taping laser cutting part 132, wherein the pattern surface of the wafer is covered with vinyl, after which the vinyl is trimmed. Then, the cutting-treated wafer is transferred to the centering part 134, wherein a second centering is carried out so that the wafer is aligned for a subsequent grinding. Then, the wafer is transferred to the grinding part 136, wherein its back side is ground.

At this time, the silicon particulate produced by the back side grinding does not affect the wafer surface, which is covered by the vinyl.

The wafer, which is back side-ground in the grinding part 136, is transferred to the cleaning part 138 so as to be cleaned, and then, is transferred to the centering part 140, wherein a third centering is carried out. Then, the wafer is transferred to the UV irradiation part 142, wherein the wafer is irradiated with a UV light. At this time, the vinyl on the wafer surface is softened such that the vinyl can be easily removed, and the wafer is transferred to the removing part 144, wherein the softened vinyl on the wafer surface is removed. Then, the wafer is transferred to the unloading part 146 and unloaded.

The above array of processes are controlled by means of controlling parts (not shown) on each of the components, and by a standard on-line communications interface with the server 124. Process information produced from each process is transmitted to the server 124, and stored therein. The process information is used by a management program of a main process in a host computer (not shown) through the network line 120.

Any of the assembled components shown in FIG. 4 can be supplemented or deleted according to the purpose of the operator, and the server 124 is operative to change its control program or change its process control conditions to adapt to a changed process environment. That is, the fabrication process can be freely changed depending on the production environment. For example, the fabrication process can be limited such that only two of the assembled components are preselected, and the non-selected components merely transfer the wafer without carrying out the process.

Therefore, as described above, first, the time-consuming loading and unloading of wafers can be minimized so as to reduce the turn around time; second, loading and unloading between facility units is minimized so as to prevent warped inferior wafers and increase the production yield; and third, manual operation or management according to the in-line operation can be simplified so as to improve the management control.

As described above, the embodiment of the present invention can be constructed such that the wafer damage during each portion and the time losses for the operation are minimized thereby optimizing productivity, which is important for large-diameter wafers which are especially vulnerable to warpage failure.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A back lapping in-line system for semiconductor device fabrication comprising:
    a server connected to a network line, and having a program therein for controlling a plurality of in-line processes, wherein the plurality of in-line processes comprises a vinyl covering process, a back side grinding process, and a vinyl removing process, performed successively; and
    an in-line facility connected to the server by a standard communication line, wherein the in-line facility has a plurality of parts, the parts are assembled in order, and each part carries out its corresponding process according to information communicated to and from the server.

2. The back lapping in-line system for semiconductor device fabrication of claim 1, wherein the plurality of parts of the in-line facility comprises:
    a loading part in which a wafer is loaded;
    a first centering part in which a first centering is carried out;
    a taping laser cutting part in which a pattern surface of the wafer is covered with vinyl and the vinyl is trimmed;
    a second centering part in which a second centering is carried out;
    a grinding part in which a back side of the wafer is ground;
    a cleaning part in which the wafer is cleaned;
    a third centering part in which a third centering is carried out;
    a UV irradiation part in which the wafer is irradiated with UV light;
    a removing part in which the vinyl softened by the UV irradiation is removed; and
    an unloading part for unloading the wafer, wherein each part of the back lapping in-line system carries out its corresponding process, and transfers the wafer controlled by communication to and from the server.

3. The back lapping in-line system for semiconductor device fabrication of claim 1, further comprising a plurality of transfer belts positioned between adjacent parts of the in-line facility, which transfers a wafer from one part to another.

4. The back lapping in-line system for semiconductor device fabrication of claim 1, further comprising a plurality of robots positioned between adjacent parts of the in-line facility, which transfers a wafer from one part to another.

5. The back lapping in-line system for semiconductor device fabrication of claim 1, wherein pre-selected parts of the plurality of parts of the in-line facility carry out their processes on a wafer, and non-selected parts transfer the wafer without carrying out their processes.

* * * * *